United States Patent [19]
Kokubo et al.

[11] Patent Number: 5,982,208
[45] Date of Patent: Nov. 9, 1999

[54] CLOCK MULTIPLIER HAVING TWO FEEDBACK LOOPS

[75] Inventors: Shoichi Kokubo; Mitsuhiro Watanabe, both of Tokyo, Japan

[73] Assignee: Oki Electric Industry Co., Ltd., Tokyo, Japan

[21] Appl. No.: 09/006,827

[22] Filed: Jan. 14, 1998

[30] Foreign Application Priority Data

Jul. 14, 1997 [JP] Japan ................................. 9-188479

[51] Int. Cl.$^6$ ................................................ H03K 21/00
[52] U.S. Cl. ...................... 327/119; 327/116; 327/159; 327/160; 377/47
[58] Field of Search .......................... 327/116, 119–122, 327/159, 160, 291, 299; 377/47, 48

[56] References Cited

U.S. PATENT DOCUMENTS 3,769,597  10/1973  Mayer ....................................... 327/119
5,317,283   5/1994  Korhonen ................................. 327/159
5,487,084   1/1996  Lindholm ................................. 327/160

FOREIGN PATENT DOCUMENTS 1-147921   6/1989  Japan.
4-2218     1/1992  Japan.
4-196715   7/1992  Japan.

*Primary Examiner*—Kenneth B. Wells
*Attorney, Agent, or Firm*—Venable; Robert J. Frank

[57] ABSTRACT

A clock multiplier controls the frequency of an output clock signal according to the frequency of an input clock signal by means of two feedback loops. The first feedback loop, active during a fixed number of initial cycles of the input clock signal, counts cycles of the output clock signal during each cycle of the input clock signal, and controls the output clock frequency according to the resulting count values. The second feedback loop, used after the fixed number of initial cycles, divides the frequency of the output clock signal, and controls the output clock frequency according to the phase difference between the resulting divided signal and the input clock signal.

18 Claims, 7 Drawing Sheets

CLOCK MULTIPLIER HAVING TWO FEEDBACK LOOPS

BACKGROUND OF THE INVENTION

The present invention relates to a clock multiplier having a phase-locked-loop (PLL) circuit configuration.

A clock multiplier receives an input clock signal and generates an output clock signal with a frequency equal to an integer multiple of the input clock frequency. Clock multipliers are widely used in computing and communication equipment, to generate clock signals for data transmission and other purposes.

A conventional clock multiplier of the PLL type has a voltage-controlled oscillator (VCO), frequency divider, phase detector, and low-pass filter coupled in a feedback loop. The VCO generates an output clock signal with a frequency responsive to an applied control voltage. The frequency divider divides the frequency of the output clock signal, the phase detector detects the phase difference between the divided signal and the input clock signal, and the low-pass filter smoothes the phase error signal produced by the phase detector to generate the control voltage applied to the VCO.

A problem with the conventional clock multiplier is that it takes considerable time for the phase-locked loop to reach a state in which the output clock signal is locked at the correct frequency. This is especially true if the input clock signal has a low frequency. If the time constant of the low-pass filter is shortened to reduce the lock acquisition time, the stability of the feedback loop is adversely affected.

The problem of slow lock acquisition is particularly troublesome in applications that generate and use the output clock signal intermittently.

SUMMARY OF THE INVENTION

It is accordingly an object of the present invention to provide a clock multiplier that can quickly acquire a locked state, then stably maintain the locked state.

The invented clock multiplier has a first feedback loop and a second feedback loop. The second feedback loop has a VCO, a frequency divider, a phase detector, and a low-pass filter, which operate as in a conventional clock multiplier. The phase detector compares an input clock signal with a divided signal output from the frequency divider, and generates a phase error signal.

The first feedback loop has a counter, a register, and a digital-to-analog converter. The counter counts cycles of the output clock signal generated by the VCO, obtaining a separate count value for each cycle of the input clock signal. The register stores a digital signal value that is modified according to the count value. The digital-to-analog converter converts the digital signal value to an analog signal.

A switching means supplies this analog signal to the low-pass filter, thereby activating the first feedback loop, for a fixed number of initial cycles of the input clock signal. The switching means then stops supplying this analog signal to the low-pass filter, and starts supplying the low-pass filter with the phase error signal produced by the phase detector, thereby switching over from the first feedback loop to the second feedback loop.

The first feedback loop reaches a substantially locked state within the above fixed number of cycles of the input clock signal. The second feedback loop then quickly acquires a final locked state, in which the frequency of the output clock signal is stabilized at the desired integer multiple of the frequency of the input clock signal.

DETAILED DESCRIPTION OF THE INVENTION

Embodiments of the invention will be described with reference to the attached illustrative drawings, following a further explanation of the conventional clock multiplier.

Figure 1:
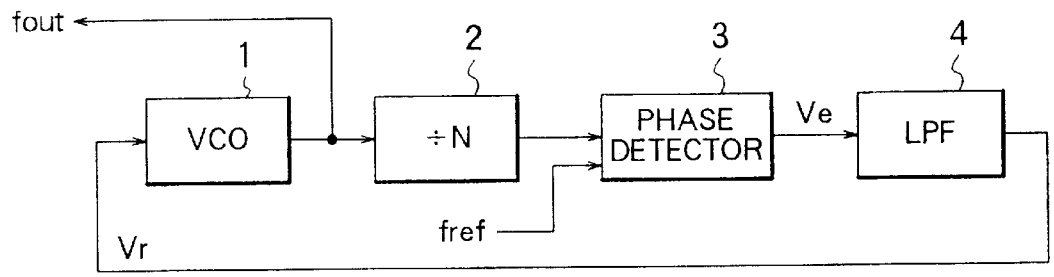
FIG. 1 is a block diagram of a conventional clock multiplier.

FIG. 1 illustrates the conventional clock multiplier described above, comprising a VCO 1, frequency divider 2, phase detector 3, and low-pass filter (LPF) 4. The input clock signal is denoted fref, the output clock signal is denoted fout, and the control voltage is denoted Vr. The frequency divider 2 divides the output clock frequency by N, an integer equal to the desired ratio of the output clock frequency to the input clock frequency.

The phase detector 3 generates a phase error signal or error voltage Ve responsive to the difference in frequency and phase between the input clock signal (fref) and the divided clock signal produced by the frequency divider 2. In the locked state, the frequency difference is zero, a constant phase difference is maintained, the error voltage Ve remains constant, and the control voltage Vr is held at a value that causes the VCO 1 to oscillate at a frequency equal to the input clock frequency multiplied by N.

Figure 2:
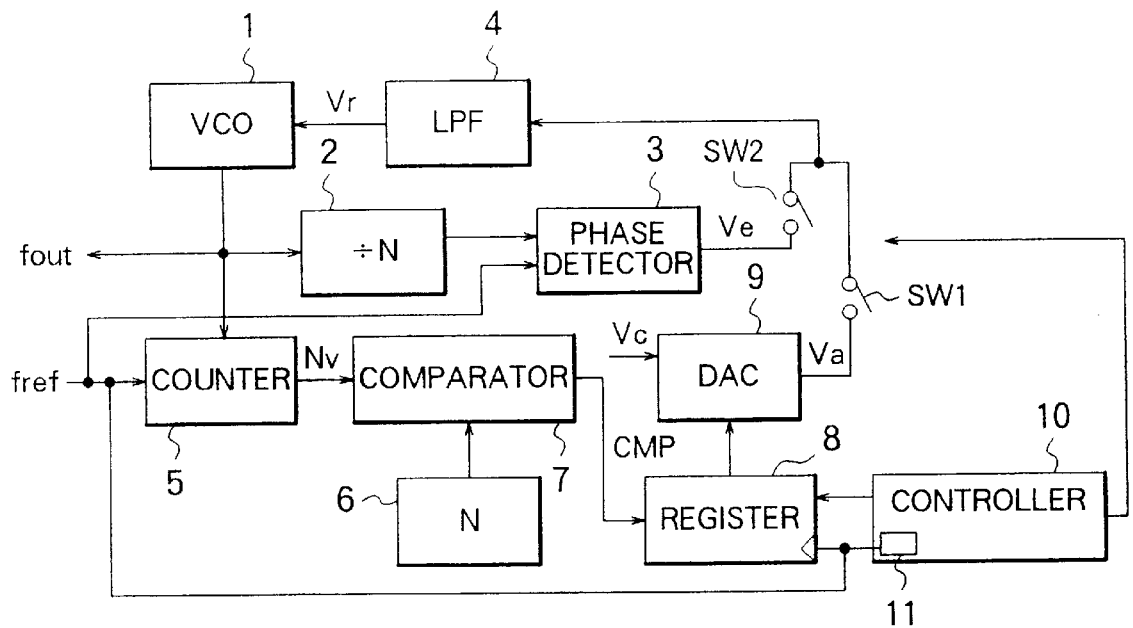
FIG. 2 is a block diagram of a first clock multiplier embodying the present invention.

FIG. 2 illustrates a first embodiment of the invention, using the same reference numerals as in FIG. 1 for corresponding elements. The elements not present in FIG. 1 belong to the first feedback loop, and to a switching means that switches between the first feedback loop and second feedback loop. The second feedback loop is similar to the feedback loop in the conventional clock multiplier, comprising a VCO 1, frequency divider 2, phase detector 3, and low-pass filter 4.

The first feedback loop comprises the same VCO 1 and low-pass filter 4, and a counter 5, memory device 6, comparator 7, register 8, and digital-to-analog converter (DAC) 9.

The switching means comprises a controller 10 with an internal counter 11, and a pair of switches SW1 and SW2 that activate and deactivate the first and second feedback loops under control of the controller 10. Switch SW1 is inserted between the digital-to-analog converter 9 and low-pass filter 4. Switch SW2 is inserted between the phase detector 3 and low-pass filter 4.

Detailed descriptions of the VCO 1, frequency divider 2, and phase detector 3 will be omitted, as these elements are well known.

Figure 3:
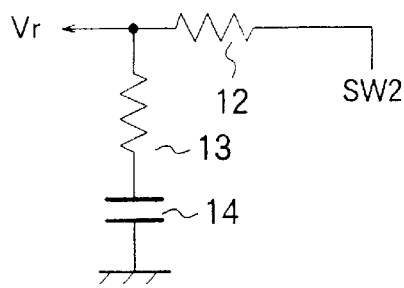
FIG. 3 shows an example of the structure of the low-pass filter in FIG. 2.

The low-pass filter 4 has, for example, the configuration shown in FIG. 3, comprising a pair of resistors 12 and 13 and a capacitor 14, coupled in series between switch SW2 and ground. The control voltage Vr is obtained from a node between resistors 12 and 13.

Referring again to FIG. 2, the counter 5 counts cycles of the output clock signal (fout) during each cycle of the input clock signal (fref). It will be assumed below that the counter 5 counts the falling transitions of fout from each falling transition of fref to the next falling transition of fref. At each falling transition of fref, that is, at the end of each cycle of the input clock signal, the counter 5 outputs the count value Nv obtained in that cycle to the comparator 7, then resets to zero and begins counting again.

The memory device 6 stores the predetermined value of N, equal to the input clock frequency divided by the desired output clock frequency.

The comparator 7 compares the count value Nv with the predetermined value N and outputs a one-bit result signal CMP, also referred to below as a result bit, indicating which value is larger. It will be assumed below that the comparator 7 outputs a '1' result bit if Nv is larger than N, indicating that the VCO 1 is oscillating too rapidly, and outputs a '0' result bit if Nv is less than N, indicating that the VCO 1 is oscillating too slowly. The result bit is also '0' if the Nv is equal to N.

Operating in synchronization with the input clock signal (fref), the register 8 latches each result bit output by the comparator 7. The result bits are stored in the register 8 in a way that will be described later. The number of bits stored in the register 8 is equal to the resolution of the digital-to-analog converter 9, denoted below by the letter M.

The digital-to-analog converter 9 converts the M-bit digital value stored in the register 8 to an analog voltage signal Va, which is supplied through switch SW2 to the low-pass filter 4. The range of Va is between zero volts and a certain voltage Vc, preferably equal to the maximum voltage in the control range of the VCO 1.

The internal counter 11 in the controller 10 counts cycles of the input clock signal (fref), and the controller 10 controls the switches SW1 and SW2 according to the input clock cycle count thus obtained. Specifically, during the first M complete input clock cycles, and any preceding partial cycle, the controller 10 closes switch SW1 and opens switch SW2, so that the first feedback loop is active and the second feedback loop is inactive. After these initial M complete cycles, the controller 10 opens switch SW1 and closes switch SW2, so that the second feedback loop is active and the first feedback loop is inactive.

Next, the operation of this embodiment will be described.

Before operation begins, the controller 10 initializes the register 8 to a digital value having '1' in the most significant bit position (MSB position), and '0' in the other bit positions. This digital value corresponds to an analog signal voltage, and control voltage, of Vc/2.

When operation begins, the controller 10 opens switch SW1 and closes switch SW2, activating the first feedback loop.

Figure 4:
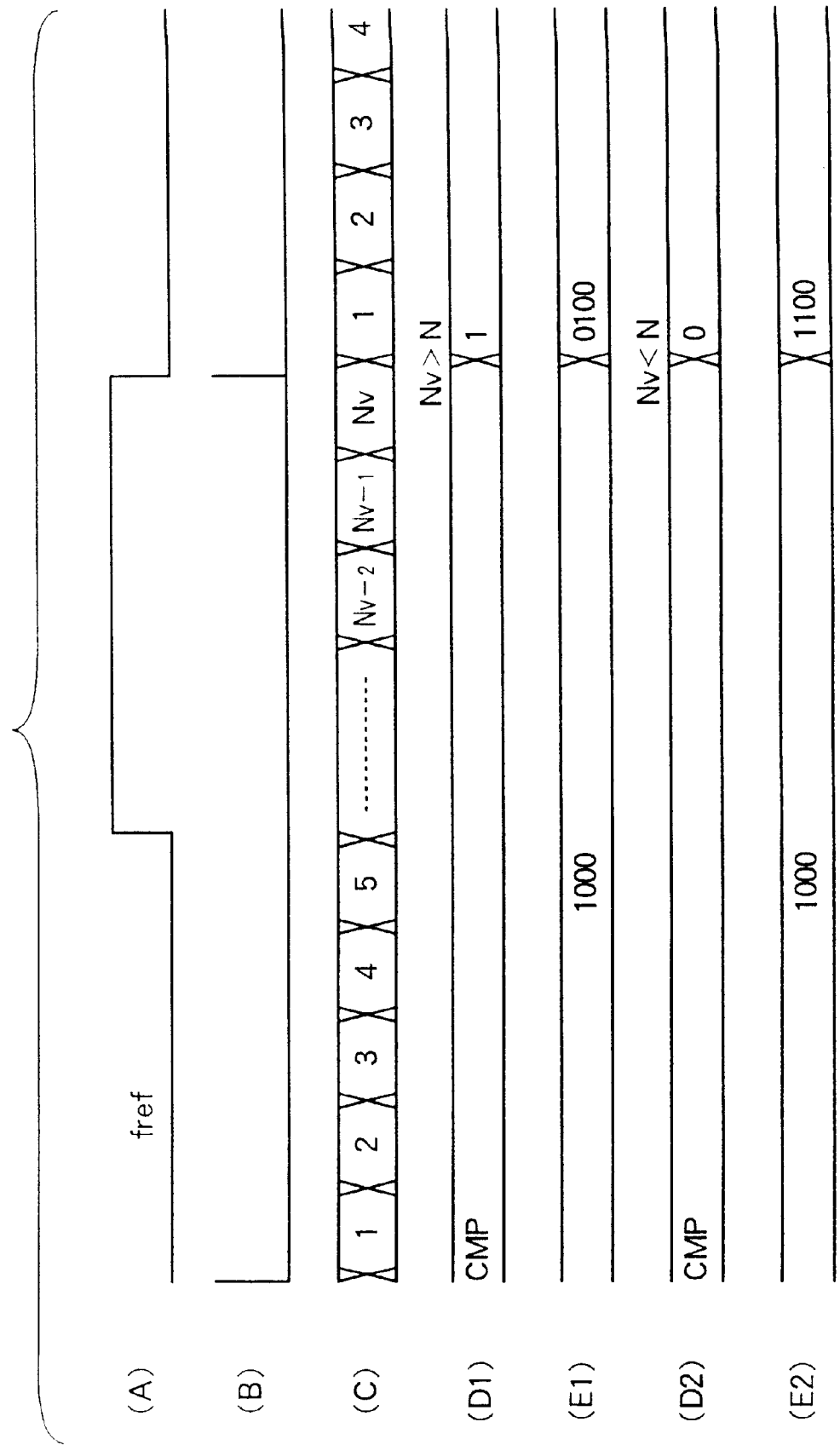
FIG. 4 shows timing waveforms illustrating the operation of the counter, comparator, and register in FIG. 2.

FIG. 4 illustrates the subsequent operation of the counter 5, comparator 7, and register 8 during the first complete input clock cycle and part of the next input clock cycle. The first line (A) is the waveform of the input clock signal (fref). The second line (B) is the waveform of an internal gate signal generated in the counter 5, which goes high momentarily at each falling transition of the input clock signal. The third line (C) illustrates the count value in the counter 5, which increments by one at each cycle of the output clock signal (fout, not shown). When the gate signal (B) goes high, the current count value Nv is output to the comparator 7, then the count value is reset, so that the in next output clock cycle, the count value becomes one.

The next line (D1) illustrates the operation of the comparator 7 when the count value Nv at the end of the first complete input clock cycle exceeds the predetermined value N. The comparator 7 outputs a '1' in this case.

The next line (E1) illustrates the corresponding operation of the register 8, assuming that the register 8 is a four-bit register (M=4). The '1' output by the comparator 7 is inverted and set as a '0' in the MSB position of the register 8. At the same time, the less significant adjacent bit is inverted, changing from '0' to '1.' The digital value in the register 8 thus changes from the initial value '1000' to the new value '0100.'

The controller 10 controls the register 8 so that the first result bit to be latched by the register 8 is the result bit output at the end of the first complete input clock cycle. If operation begins with a partial input clock cycle, the result bit for that cycle is not latched.

The next two lines (D2 and E2) illustrate the operation of the comparator 7 and register 8 when the first count value Nv is less than the predetermined value N. In this case, the comparator 7 outputs a '0' result bit, which is inverted and set as a '1' in the MSB position in the register 8. The adjacent bit in the register 8 is also inverted, so the new digital value becomes '1100.'

Figure 5:
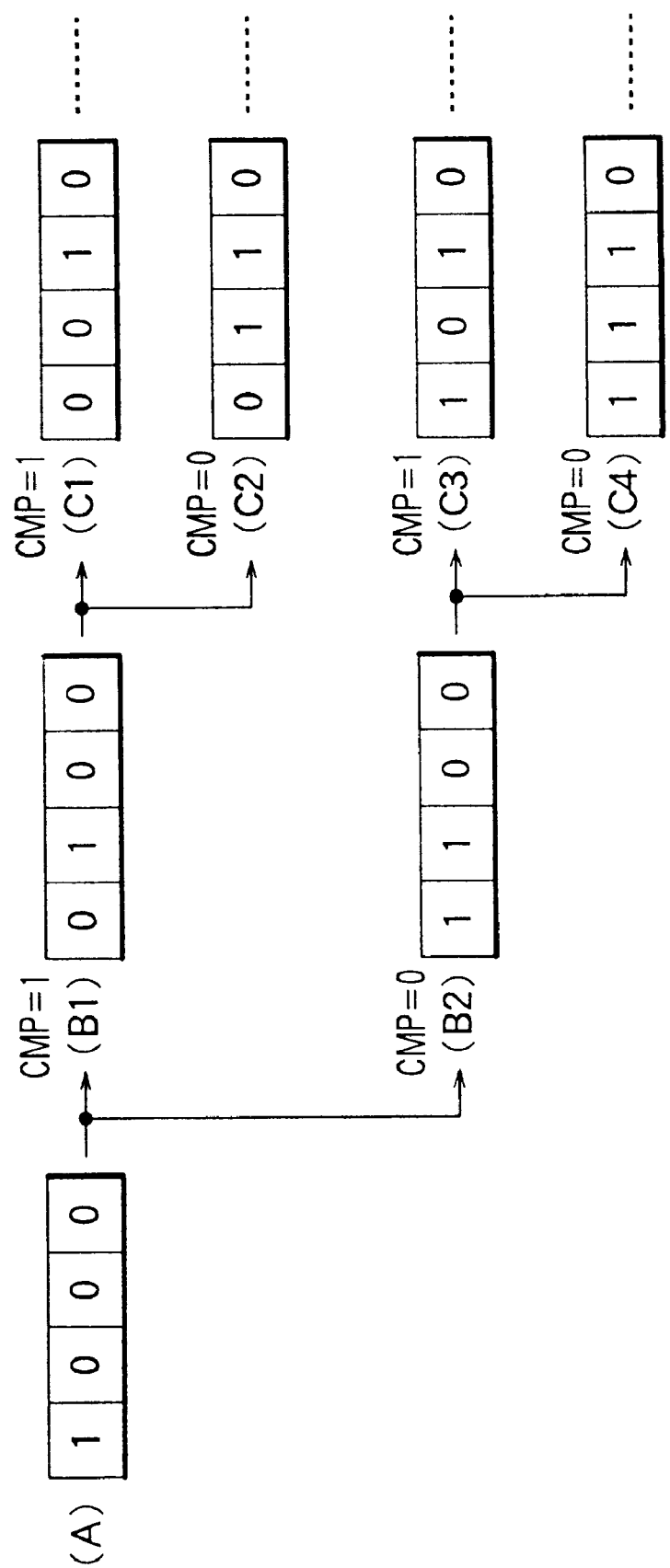
FIG. 5 further illustrates the operation of the register in FIG. 2.

FIG. 5 further illustrates the operation of the register 8, showing the initial value (A), the two possible values (B1 and B2) after the first complete input clock cycle, and the four possible values (C1, C2, C3, and C4) after the second complete input clock cycle. After the second complete input clock cycle, the result bit (CMP) is inverted and set in the second bit position, while the MSB remains unchanged, and the bit in the third bit position is inverted from '0' to '1.'

In general, the k-th result bit received from the comparator 7 is inverted and set in the k-th bit position. At the same time, the (k+1)-th bit position is inverted from '0' to '1' (k=1, 2, ..., M−1). When the M-th result bit is received, it is inverted and set in the M-th bit position. This is the least significant bit position, so there is no (M+1)-th bit to invert.

Figure 6:
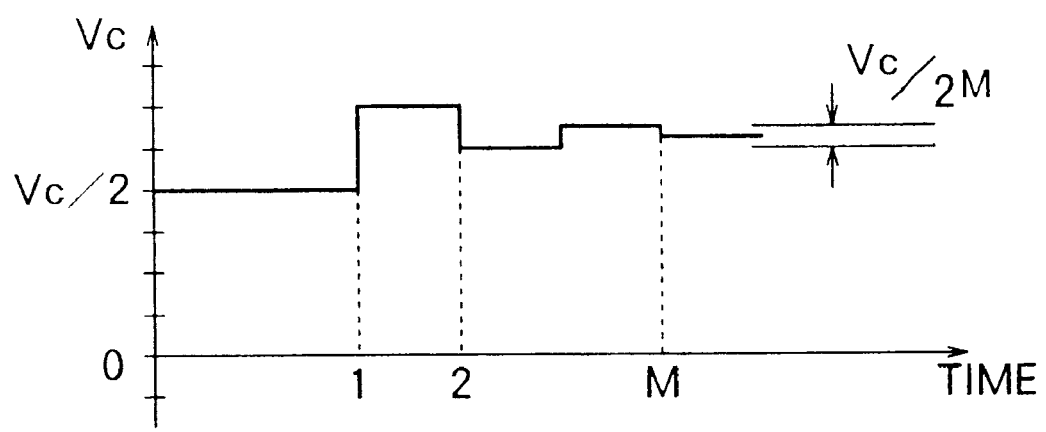
FIG. 6 shows an example of a waveform output by the digital-to-analog converter in FIG. 2.

FIG. 6 shows an example of the analog signal waveform output by the digital-to-analog converter 9. The analog signal voltage Va is shown on the vertical axis. Time is indicated on the horizontal axis; the numbers on the horizontal axis indicate the end of the first, second, and M-th complete input clock cycles.

Initially, the register 8 holds the value '1000' and the analog signal voltage level is Vc/2. The control voltage Vr is also equal to Vc/2.

At the end of the first complete input clock cycle, if the first result bit is a '0,' indicating that the control voltage Vr is too low, the digital value in the register 8 changes to '1100' and the analog signal voltage rises to 3Vc/4. As the capacitor 14 in the low-pass filter 4 charges, the control voltage Vr also rises to 3Vc/4.

If the next result bit is a '1,' indicating that the control voltage is now too high, then the digital signal value changes to '1010' and the analog signal voltage Va changes to 5Vc/8. Capacitor 14 now discharges, and the control voltage Vr falls back to 5Vc/8.

During the next two input clock cycles, Va and Vr first rise to 11Vc/16, then fall to 21Vc/32. In each input clock cycle, the change in Va and Vr is one-half the change in the preceding input clock cycle.

The maximum error likely to occur in the control voltage similarly decreases by one-half. During the first complete input clock cycle, while the register 8 still contains its initial value, the Vr error in may be as great as Vc/2, but during the M-th cycle the maximum likely Vr error is reduced to $Vc/2^M$ (Vc/16 in the present example).

If the control voltage Vr and VCO 1 were to respond instantly to changes in the analog signal Va, these maximum likely limits would be strictly enforced, and in the M-th complete input clock cycle, the analog signal Va and control voltage Vr would both be correct within the limits of the resolution of the digital-to-analog converter 9. Because of the low-pass filter 4, the response is not instantaneous, but even so, Va and Vr converge to values close to the correct values.

At the end of the M-th cycle, the least significant bit of the register 8 may change from '1' to '0,' but this does not necessarily improve the accuracy of Va and Vr. The work of the first feedback loop is complete at the end of the M-th cycle, at which point a substantially locked state has been reached.

The controller 10 now opens switch SW1, closes switch SW2, and switches control of the output clock frequency over to the frequency divider 2 and phase detector 3 in the second feedback loop. The second feedback loop further adjusts the control voltage Vr so that the output clock signal becomes accurately locked at a frequency equal to N times the frequency of the input clock signal. Since the frequency of the output clock signal is already nearly equal to N times the input clock frequency when the second feedback loop is activated, the second feedback loop is able to acquire the final locked state quickly. Once locked, the second feedback loop maintains stable clock output, the phase detector 3 providing high frequency accuracy and the low-pass filter 4 providing high immunity to noise.

In conventional clock multipliers, it is difficult to guarantee that lock will be acquired within any given time, and considerable time may indeed be necessary, if the initial frequency of the VCO departs greatly from the correct frequency. In the present embodiment, the first feedback loop always reaches the substantially locked state within M input clock cycles, after which the second feedback loop can acquire final lock in a predictably short time. A useful output clock signal is thus obtained quickly, within a time that can easily be guaranteed.

Next, a second embodiment of the invention will be described with reference to FIG. 7, using the same reference numerals as in FIG. 1 for corresponding elements.

Figure 7:
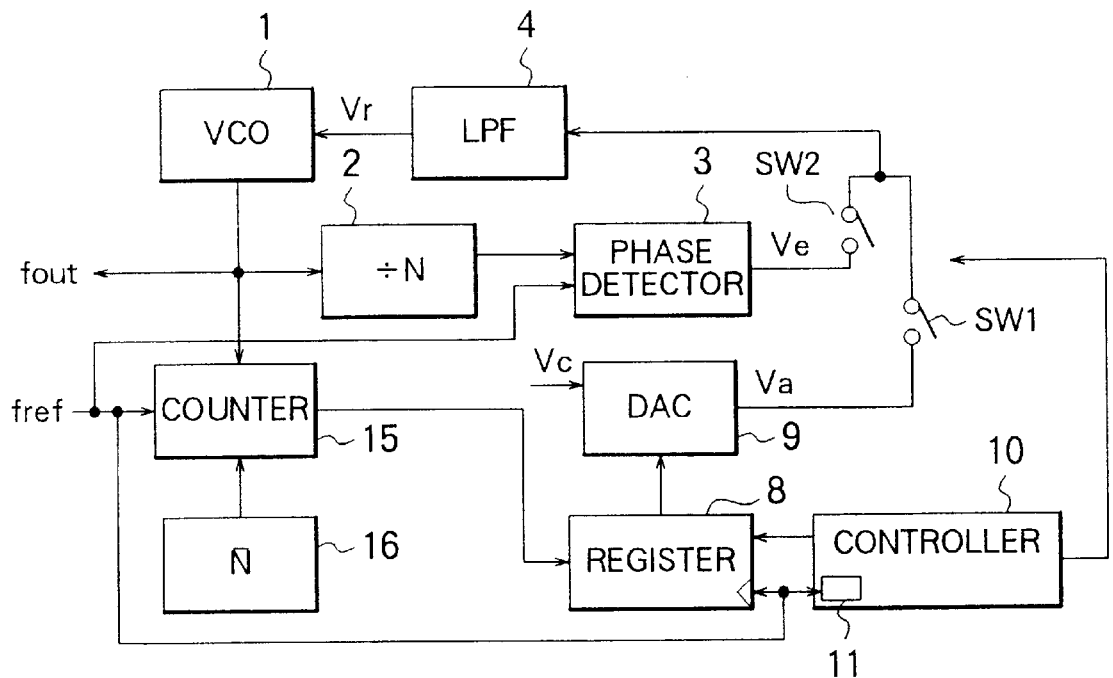
FIG. 7 is a block diagram of a second clock multiplier embodying the present invention.

The counter 15 in FIG. 7 is a presettable or reloadable counter that is reloaded with the one's complement of the frequency multiple value N at each falling transition of the input clock signal. The one's complement of N, denoted $\overline{N}$ in the drawing, is supplied from a memory device 16. The one's complement of N is algebraically equivalent to minus one minus N (that is, to −1 −N).

The counter 15 counts up from this value. If the count value overflows from minus one to zero, the counter 15 outputs a carry signal from the most significant bit. The carry signal is output at the point when the number of output clock cycles counted exceeds N, and continues to be output until the counter 15 is reloaded at the next falling transition of the input clock signal.

The counter 15 and memory device 16 take the place of the counter 5, memory device 6, and comparator 7 in the first embodiment, the carry signal output by the counter 15 fulfilling the function of the result signal from the comparator 7. In the second embodiment, accordingly, the first feedback loop comprises the counter 15, memory device 16, register 8, and digital-to-analog converter 9.

The second embodiment operates in the same way as the first embodiment. When the VCO frequency is too high, the counter 15 counts more than N output clock cycles in one input clock cycle, overflows from minus one to zero, and generates a carry signal having the value '1.' The register 8 inverts this value and stores a '0' at the relevant bit position.

When the VCO frequency is not too high, the counter 15 counts N or fewer output clock cycles in one input clock cycles and does not generate a carry. The register 8 then receives from the counter 15 a '0' value, which is inverted to '1' and stored in the relevant bit position.

The second embodiment achieves the same effects as the first embodiment, but with a simpler circuit configuration, in that no comparator is necessary.

Next, a third embodiment will be described.

The difference between the third embodiment and the first and second embodiments concerns the low-pass filter 4. Other elements may be identical to the corresponding elements in either the first or second embodiment, as shown in FIGS. 1 and 7.

Figure 8:
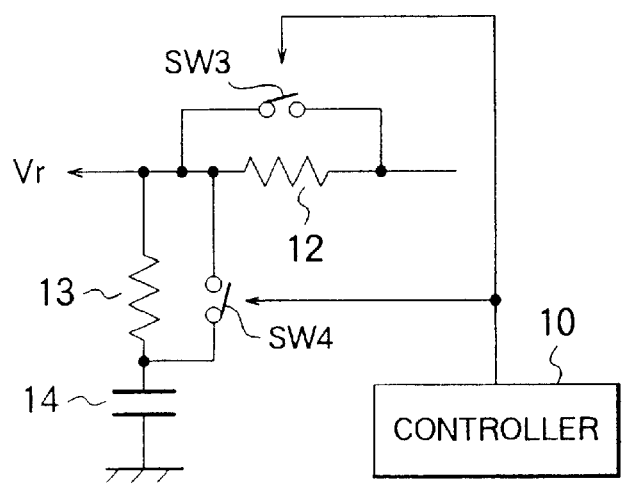
FIG. 8 is a circuit diagram of the low-pass filter in a third clock multiplier embodying the present invention.

Referring to FIG. 8, the low-pass filter 4 in the third embodiment comprises a pair of resistors 12 and 13 and a capacitor 14, as in the example given in the first embodiment, but also comprises a pair of switches SW3 and SW4 that are controlled by the controller 10. Switch SW3 bypasses resistor 12. Switch SW4 bypasses resistor 13.

Figure 9:
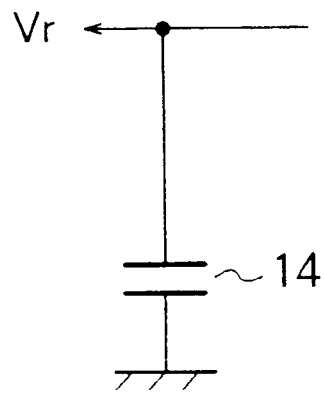
FIG. 9 is an equivalent circuit diagram of the low-pass filter in FIG. 8, when the switches are closed.

During the first M input clock cycles, while the first feedback loop is active, the controller 10 closes both switches SW3 and SW4. The low-pass filter 4 is then equivalent to the circuit in FIG. 9, a simple low-pass filter formed by the single capacitor 14. Since the resistors 12 and 13 are bypassed, the capacitor 14 charges and discharges quickly, and the VCO 1 responds promptly to changes in the analog signal output by the digital-to-analog converter 9.

Figure 10:
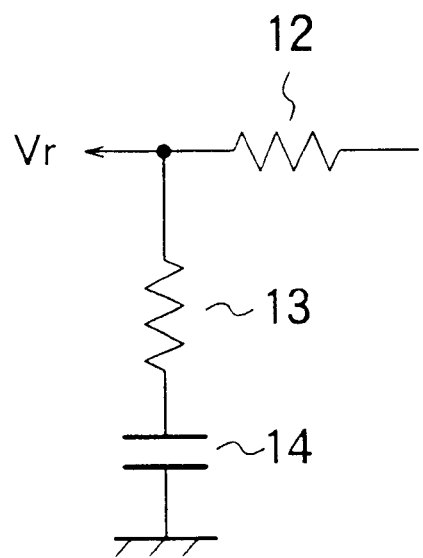
FIG. 10 is an equivalent circuit diagram of the low-pass filter in FIG. 8, when the switches are open.

After the first M input clock cycles, when the second feedback loop becomes active, the controller 10 opens both switches SW3 and SW4. The low-pass filter 4 is now equivalent to the circuit in FIG. 10, which is identical to FIG. 3. The capacitor 14 charges and discharges more slowly, current flow being limited by resistors 12 and 13, and the same type of low-pass filtering as in the first and second embodiments is obtained.

While the first feedback loop is active, accordingly, the third embodiment reduces the time constant of the low-pass filter 4, so that the control voltage Vr responds more quickly to changes in the analog signal Va. This faster response enables the first feedback loop to converge more accurately, producing better values of the analog signal Va and control voltage Vr than in the first embodiment and second embodiments. The faster loop response is particularly desirable when the input clock signal has a high frequency.

After the substantially locked state is acquired, the time constant is increased and the second feedback loop operates in the same stable manner as in the first and second embodiments.

Figure 11:
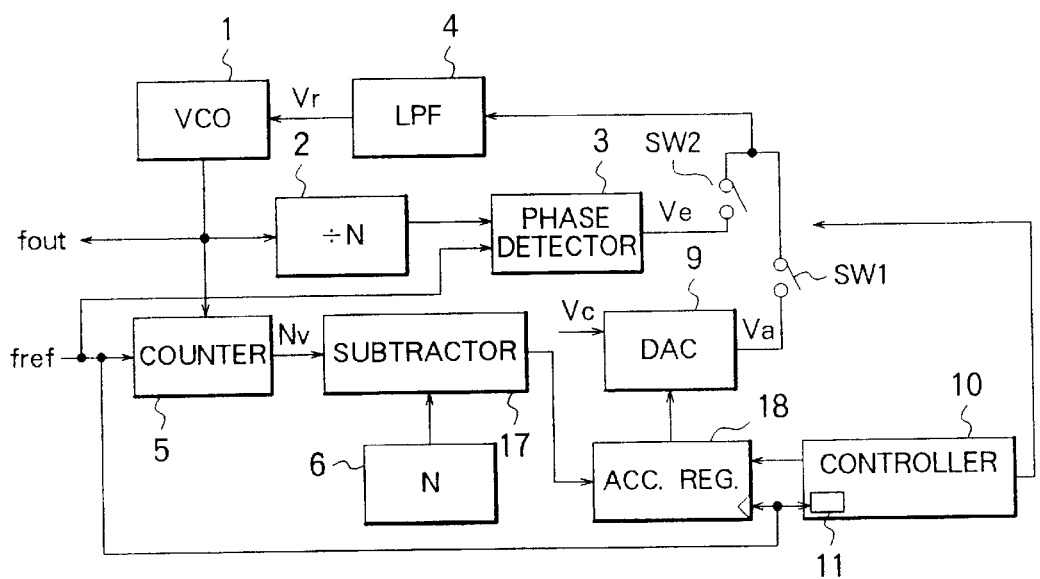
FIG. 11 is a block diagram of a fourth clock multiplier embodying the present invention.

Next, a fourth embodiment will be described with reference to FIG. 11, using the same reference numerals as in FIG. 1 for corresponding elements.

The fourth embodiment replaces the comparator 7 of the first embodiment with a subtractor 17, which subtracts the count value output from the counter 5 from the predetermined value N stored in the memory device 6, and outputs the difference. All bits of the difference are added at once to the existing contents of an accumulator register (ACC. REG.) 18, the resulting sum replacing the existing contents of the accumulator register 18.

Depending on the loop gain of the first feedback loop, the fourth embodiment enables the substantially locked state to be reached in fewer than M input clock cycles. If necessary, the loop gain of the first feedback loop can be adjusted, by multiplying the difference output by the subtractor 17 by a constant, to obtain an optimum balance between stability and convergence speed. The controller 10 switches over from the first feedback loop to the second feedback loop after a fixed number of input clock cycles, but this fixed number may now be less than M.

The fourth embodiment is especially useful when the input clock signal has a low frequency and the value of N is large, as the difference between the count value and N can then give the necessary adjustment to the accumulator register value quite accurately. The switchover from the first feedback loop to the second feedback loop can accordingly be made after just a few input clock cycles, a distinct advantage when the input clock frequency is low.

To enable the control voltage Vr to track possible rapid changes in the analog signal Va, the low-pass filter of the third embodiment can be employed in the fourth embodiment.

With its ability to acquire the locked state quickly, the present invention is well suited for use in equipment that generates a high-frequency clock signal only intermittently. Examples include computing equipment with built-in serial ports that are operated on an as-required basis, or with built-in analog-to-digital converters that operate on a similar basis.

The invention is not limited to the foregoing embodiments; numerous variations are possible.

In the first three embodiments, the setting of the M-th result bit in the register 8 may be omitted.

In the second embodiment, instead of counting up from the one's complement of N and generating a carry signal, the counter 5 can count down from N and generate a carry signal upon underflow from zero to minus one.

Similarly, in the first embodiment, the counter 5 can count down from zero, and the comparator 7 can compare the count value with the complement of N.

In the third embodiment, switches SW3 and SW4 need not be opened and closed simultaneously. The controller 10 can alter the delay characteristics of the low-pass filter by opening and closing just one of these two switches, the other switch being left open. The switch that is always left open can be eliminated from the circuit configuration in FIG. 8.

Many other modifications of the low-pass filter circuit configuration are possible, in all of the embodiments.

Those skilled in the art will recognize that further variations are possible within the scope claimed below.

What is claimed is:

1. A clock multiplier receiving an input clock signal with a first frequency, for generating an output clock signal with a second frequency equal to an integer multiple of the first frequency, comprising:

a voltage-controlled oscillator for generating said output clock signal;

a low-pass filter coupled to said voltage-controlled oscillator, for generating a control voltage controlling an oscillation frequency of the voltage-controlled oscillator, thus controlling said second frequency;

a first feedback loop having
a counter coupled to said voltage-controlled oscillator and receiving said input clock signal, for counting cycles of said output clock signal during each cycle of said input clock signal, thereby generating a count value at an end of each cycle of said input clock signal;
a register coupled to said comparator, for storing a digital signal value responsive to said count value; and
a digital-to-analog converter coupled to said register, for converting said digital signal value to an analog signal;

a second feedback loop having
a frequency divider coupled to said voltage-controlled oscillator for dividing said second frequency to produce a divided signal; and
a phase detector coupled to said frequency divider for comparing said input clock signal and said divided signal, thereby generating a phase error signal; and a switching means coupled to said digital-to-analog converter and said phase detector, for supplying said analog signal to said low-pass filter, thereby activating said first feedback loop, for a certain number of initial cycles of said input clock signal, then supplying said phase error signal to said low-pass filter, thereby switching over from said first feedback loop to said second feedback loop.

2. The clock multiplier of claim 1, wherein said register receives, at the end of each said cycle of said input clock signal, a result bit responsive to said count value, successive result bits being set in successive bit positions in said register, starting from a most significant bit position.

3. The clock multiplier of claim 2 wherein, when each said result bit is set in said register, a less significant adjacent bit in said register is inverted.

4. The clock multiplier of claim 2, further comprising a comparator disposed between said counter and said register, for generating each said result bit by comparing said count value with a predetermined value.

5. The clock multiplier of claim 4, wherein said predetermined value is equal to said second frequency divided by said first frequency.

6. The clock multiplier of claim 2, wherein said counter is reloaded with a predetermined value when each said cycle of said input clock signal begins, counts up from said predetermined value, and generates said result bit as a carry signal.

7. The clock multiplier of claim 2, wherein said counter is reloaded with a predetermined value when each said cycle of said input clock signal begins, counts down from said predetermined value, and generates said result bit as a borrow signal.

8. The clock multiplier of claim 1, further comprising a subtractor disposed between said counter and said register, for calculating a difference between said count value and a predetermined value, said difference being used to modify said digital signal value.

9. The clock multiplier of claim 1, wherein said low-pass filter has a configuration that is altered by said switching means when said switching means switches over from said first feedback loop to said second feedback loop, said switching means thus giving said first feedback loop a faster response than said second feedback loop.

10. The clock multiplier of claim 1, wherein said low-pass filter comprises:

a resistor;

a capacitor coupled in series with said resistor; and a switch coupled in parallel with said resistor, for bypassing said resistor when said first feedback loop is active.

11. A method of controlling a frequency of an output clock signal generated by a voltage-controlled oscillator, to make the frequency of the output clock signal a certain integer multiple of a frequency of an input clock signal, comprising the steps of:

counting cycles of said output clock signal during each of a fixed number of cycles of said input clock signal, thus obtaining respective count values;

supplying said voltage-controlled oscillator with a control voltage responsive to said count values during said fixed number of cycles of said input clock signal;

detecting a phase difference between said input clock signal and said output clock signal, thus obtaining a phase error signal; and supplying said voltage-controlled oscillator with a control voltage responsive to said phase error signal after said fixed number of cycles of said input clock signal.

12. The method of claim 11, further comprising the steps of:

setting successive bits in a register according to said count values, starting from a most significant bit in said register; and converting resulting contents of said register from digital to analog form, thereby obtaining the control voltage supplied to said voltage-controlled oscillator during said fixed number of cycles of said input clock signal.

13. The method of claim 12, further comprising the step, performed when each successive bit is set in said register, of:

inverting a less significant adjacent bit of said register.

14. The method of claim 12, further comprising the step of comparing said count values with a predetermined value, thus obtaining comparison results, the bits in said register being set according to the comparison results.

15. The method of claim 12, wherein:

said step of counting is performed by counting up from a predetermined value; and the bits in said register are set according to whether said step of counting produces a carry.

16. The method of claim 12, wherein:

said step of counting is performed by counting down from a predetermined value; and the bits in said register are set according to whether said step of counting produces a borrow.

17. The method of claim 11, further comprising the steps of:

calculating differences between said count values and a predetermined value;

modifying a register value according to said differences; and converting said register value from digital to analog form, thereby obtaining the control voltage supplied to said voltage-controlled oscillator during said fixed number of cycles of said input clock signal.

18. The method of claim 11, further comprising the steps of:

generating an analog signal responsive to said count values;

low-pass filtering said analog signal with a first time constant, thereby obtaining the control voltage supplied to said voltage-controlled oscillator during said fixed number of cycles of said input clock signal; and low-pass filtering said phase error signal with a second time constant exceeding said first time constant, thereby obtaining the control voltage supplied to said voltage-controlled oscillator after said fixed number of cycles of said input clock signal.

* * * * *